US008415765B2

(12) United States Patent
Masada et al.

(10) Patent No.: US 8,415,765 B2
(45) Date of Patent: Apr. 9, 2013

(54) SEMICONDUCTOR DEVICE INCLUDING A GUARD RING OR AN INVERTED REGION

(75) Inventors: Atsuya Masada, Kyoto (JP); Mitsuo Horie, Niigata (JP)

(73) Assignee: Panasonic Corporation, Osaka (JP)

( * ) Notice: Subject to any disclaimer, the term of this patent is extended or adjusted under 35 U.S.C. 154(b) by 273 days.

(21) Appl. No.: 12/707,209

(22) Filed: Feb. 17, 2010

(65) Prior Publication Data
US 2010/0244194 A1  Sep. 30, 2010

(30) Foreign Application Priority Data

Mar. 31, 2009 (JP) ............... P2009-086976
Mar. 31, 2009 (JP) ............... P2009-086977

(51) Int. Cl.
*H01L 29/866* (2006.01)
(52) U.S. Cl. . 257/605; 257/106; 257/495; 257/E21.356; 257/E29.012; 257/E29.013; 438/983
(58) Field of Classification Search .......... 257/106, 257/E21.356, 495, 605, E29.012–E29.013; 438/983
See application file for complete search history.

(56) References Cited

U.S. PATENT DOCUMENTS

| | | | | |
|---|---|---|---|---|
| 5,336,924 A * | 8/1994 | Quint | ............... | 257/603 |
| 5,362,980 A * | 11/1994 | Gough | ............... | 257/355 |
| 2001/0050374 A1 * | 12/2001 | Yoshitake | ............... | 257/104 |
| 2003/0170943 A1 * | 9/2003 | Shibib | ............... | 438/197 |
| 2003/0189220 A1 * | 10/2003 | Hamerski | ............... | 257/200 |
| 2003/0222272 A1 * | 12/2003 | Hamerski | ............... | 257/106 |
| 2004/0000700 A1 * | 1/2004 | Romas et al. | ............... | 257/603 |
| 2007/0018283 A1 * | 1/2007 | Fujii | ............... | 257/606 |
| 2011/0175199 A1 * | 7/2011 | Lin et al. | ............... | 257/605 |

FOREIGN PATENT DOCUMENTS

| | | |
|---|---|---|
| JP | 2005-303032 | 10/2005 |
| JP | 2006-179518 | 7/2006 |

* cited by examiner

*Primary Examiner* — Fernando L Toledo
*Assistant Examiner* — Peter Bradford
(74) *Attorney, Agent, or Firm* — McDermott Will & Emery LLP

(57) ABSTRACT

A semiconductor device including a semiconductor substrate having a first conductive type layer; a first diffusion region which has the first conductive type and is formed in the first conductive type layer; a second diffusion region which has a second conductive type and an area larger than an area of the first diffusion region and overlaps the first diffusion region; and a PN junction formed at an interface between the first and the second diffusion regions. The second diffusion region includes a ring shaped structure or a guard ring includes an inverted region which has the second conductive type. According to such a configuration, it is possible to provide a semiconductor device having the required Zener characteristics with good controllability.

6 Claims, 19 Drawing Sheets

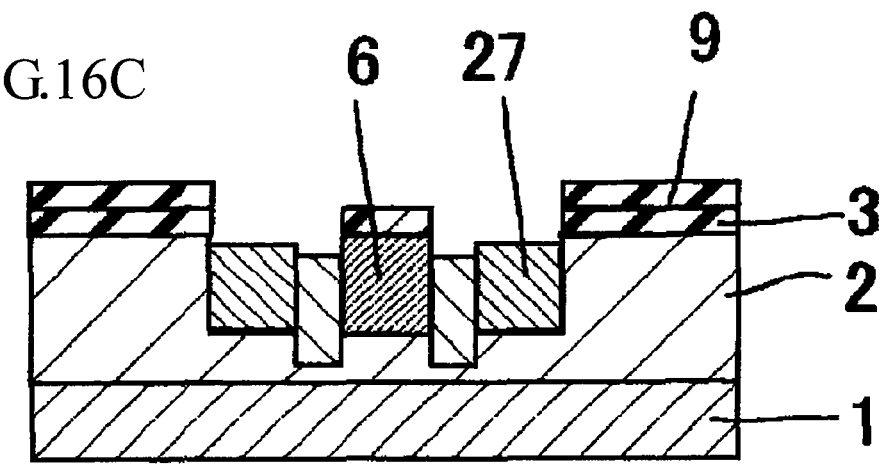
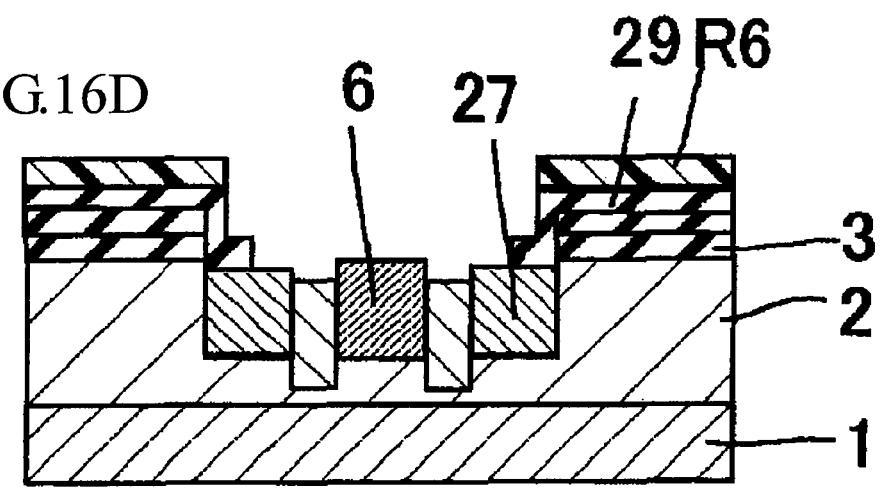
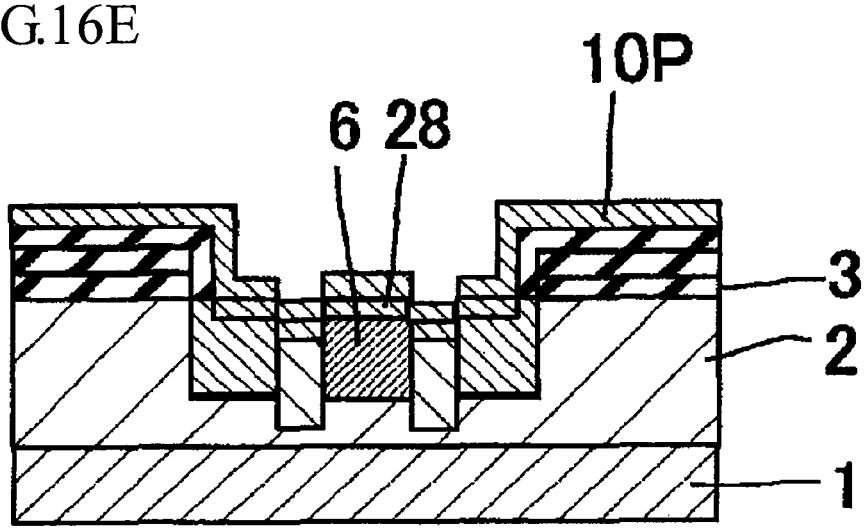

SEMICONDUCTOR DEVICE INCLUDING A GUARD RING OR AN INVERTED REGION

REFERENCE TO RELATED APPLICATIONS

The present application claims foreign priority from Japanese Patent Application No. 2009-086976 filed on Mar. 31, 2009 and Japanese Patent Application No. 2009-086977 filed on Mar. 31, 2009, and the subject matters of which are incorporated herein by reference.

TECHNICAL FIELD

The present invention relates to a semiconductor device and a manufacturing method thereof. Especially, the invention relates to a technology for a precise categorization of Zener voltage of a diode.

BRIEF DESCRIPTION OF RELATED ART

As a related Zener diode, a Zener diode provided with a p-layer which is diffused in N/N+ epitaxial wafer is proposed.

FIG. 11 shows an example of a structure of a related Zener diode described in JPA-2006-179518. As shown in FIG. 11, the related Zener diode is provided with a PN junction. The PN junction is manufactured by forming a p-type diffusion layer 103 on a N+ epitaxial layer 102. On the N+ epitaxial layer 102, a guard ring 104 is provided. The reference number 105 indicates an insulating film, the reference number 101 indicates an anode electrode and the reference number 107 indicates an electrode for wire bonding. The manufacturing method for the related Zener diode is as follows: forming a poly-silicon layer 106 on the N+ epitaxial layer 102 where the guard ring 104 is provided, applying poly-boron film (not shown) on a surface of the poly-silicon layer 106, and forming the p-type diffusion layer 103 by thermally diffusing boron. The Zener voltage of the related Zener diode is uniquely determined by a relationship between the impurity concentrations in the N+ epitaxial layer 102 and the p-type diffusion layer 103.

JP-A-2005-303032 proposes a manufacturing method for a similar related Zener diode.

Recently, a standard for Zener diodes precisely categorizes Zener diodes by Zener voltage thereof. Since a range of Zener voltage for one category is very severe, the manufacturing yield is deteriorated in a case where Zener voltage deviates between each wafers or manufacture lots. In such situations, since semiconductor devices of required Zener voltage are less obtained, there is a problem in view of manufacturing.

Once the impurity concentration in the epitaxial layer deviates, Zener voltage deviates proportionally to the deviation of the impurity concentration. Now that controls of the impurity concentration in the epitaxial layer nearly reach its possible limit, it is difficult to obtain Zener diodes of required Zener voltage with a high yield Also, in the above described related Zener diode, since Zener voltage is uniquely determined by a relationship between the impurity concentrations in the N+ epitaxial layer and the P-type diffusion layer, it is necessary to prepare epitaxial wafers, each of which has a certain impurity concentration corresponding to a required Zener voltage respectively. Therefore, a tremendous number of wafers are necessary in stock.

SUMMARY

The exemplary embodiment of the present invention addresses above described problems and may address problems not described above. The exemplary embodiment reduces the deviation of Zener voltage due to the impurity concentration of the epitaxial layer, and provides semiconductor devices of required Zener voltage with high yield. Especially, the exemplary embodiment is aimed at providing a low voltage Zener diode with high yield.

The first aspect of the exemplary embodiments of the present invention is A semiconductor device comprising: a semiconductor substrate having a first conductive type layer; a first diffusion region which has the first conductive type and is formed in the first conductive type layer; a second diffusion region which has a second conductive type and an area larger than an area of the first diffusion region and overlaps the first diffusion region; and a PN junction formed at an interface between the first and the second diffusion regions.

In another aspect of the semiconductor device according to the first aspect, the PN junction has a lower breakdown voltage than a breakdown voltage between the first conductive type layer and the second diffusion region.

In another aspect of the semiconductor device according to the first aspect, a first conductive type impurity concentration of the first diffusion region is larger than a first conductive type impurity concentration of the first conductive type layer.

In another aspect of the semiconductor device according to the first aspect, the semiconductor device includes an insulator layer having an opening which is self-aligned to an edge of the second diffusion region.

In another aspect of the semiconductor device according to the first aspect, the second diffusion region includes a ring shaped structure which surrounds the PN junction.

In another aspect of the semiconductor device according to the first aspect, the semiconductor device includes a guard ring having second conductive type which surrounds the PN junction, wherein the second diffusion region has a larger impurity concentration than a impurity concentration of the guard ring.

In the another aspect of the semiconductor device according to the first aspect, a bottom of the first diffusion region is deeper than a bottom of the second diffusion region, and a bottom of the guard ring is deeper than the bottom of the first diffusion region.

Preferably, the second diffusion region is formed by inverting the conductive type of the first diffusion region.

According to the first aspect of the exemplary embodiments of the present invention, the first diffusion region is formed by doping an impurity of required concentration without any effects of the resistivity (impurity concentration) of the semiconductor layer (semiconductor substrate), and the Zener voltage is determined by the impurity concentration of the second diffusion region relative to the impurity concentration of the first diffusion region. Therefore, it is possible to provide a semiconductor device of the required Zener voltage with high controllability. Also, since the first diffusion region is formed by impurity doping, many kinds of wafers are not necessary in stock. and the productivity is improved.

According to the first aspect of the exemplary embodiments of the present invention, the PN junction between the first diffusion region and the second diffusion region breakdown at smaller voltage than the breakdown voltage of the peripheral portion. Therefore, while the inverse current flow as a Zener diode, the inverse current flow through the PN junction between the first diffusion region and the second diffusion region and hardly flow through the other portions. Thus, the breakdown occurs at the PN junction.

The second aspect of the exemplary embodiments of the present invention is a manufacturing method of a semiconductor device comprising: preparing a semiconductor substrate having a first conductive type layer; doping a first conductive type impurity into the first conductive type layer so as to form a first diffusion region; and doping a second conductive type impurity into the first conductive type layer so as to form a second diffusion region which has an area larger than an area of the first region and overlaps the first diffusion region, wherein a part of the first diffusion region is inverted from the first conductive type to the second conductive type by doping the second type impurity so as to form a PN junction.

In another aspect of the manufacturing method for a semiconductor device according to the second aspect, the first conductive type layer is formed by epitaxial growth.

In another aspect of the manufacturing method of the semiconductor device according to the second aspect, the method includes forming an insulator layer prior to doping the first conductive type impurity, the insulator layer including an opening which corresponds to the second diffusion region.

In another aspect of the manufacturing method of the semiconductor device according to the second aspect, the first impurity is doped by using a resist mask, the resist mask having an opening smaller than the opening of the insulator layer.

In another aspect of the manufacturing method of the manufacturing method of the semiconductor device according to the second aspect, the method includes doping the second type impurity into the first conductive type layer so as to form a guard ring, wherein a second part of the first diffusion region is inverted from the first conductive type to the second conductive type by doping the second type impurity so as to form the guard ring In another aspect of the manufacturing method of the manufacturing method of the semiconductor device according to the second aspect, doping the first conductive type impurity so as to form the first diffusion region, doping the second conductive type impurity so as to form the guard ring, and doping the second type impurity so as to form the second diffusion region are performed in this order.

In another aspect of the manufacturing method of the semiconductor device according to the second aspect, the guard ring is formed deeper than the first diffusion region.

In another aspect of the manufacturing method of the semiconductor device according to the second aspect, the method includes forming an insulator layer prior to doping the first conductive type impurity, the insulator layer including an opening which corresponds to the size of the guard ring.

In another aspect of the manufacturing method of the semiconductor device according to the second aspect, the first type impurity is doped by using a resist mask which has an opening smaller than the opening of the insulator layer.

According to the second aspect of the exemplary embodiments of the present invention, the first diffusion region is formed by doping an impurity of required concentration without any effects of the resistivity (impurity concentration) of the semiconductor layer (semiconductor substrate), and the Zener voltage is determined by the impurity concentration of the second diffusion region relative to the impurity concentration of the first diffusion region. Therefore, it is possible to provide a semiconductor device of the required Zener voltage with high controllability. Also, since the first diffusion region is formed by impurity doping, many kinds of wafers are not necessary in stock. and the productivity is improved.

According to the second aspect of the exemplary embodiments of the present invention, the PN junction between the first diffusion region and the second diffusion region breakdown at smaller voltage than the breakdown voltage of the peripheral portion. Therefore, while the inverse current flow as a Zener diode, the inverse current flow through the PN junction between the first diffusion region and the second diffusion region and hardly flow through the other portions. Thus, the breakdown occurs at the PN junction.

According to the second aspect of the exemplary embodiments of the present invention, since a large opening is formed at the early stage of the manufacturing process, steps are less formed at the peripheral portion of the PN junction. When a step is formed in the surface, the impurity doping profile has a step and the first and the second diffusion regions also have steps respectively because of the step in the doping profile. The electrical field tends to concentrates in the step. On the other hand, according to the second aspect, a diffusion profile without step is obtained and the electrical field concentration is prevented.

According to the second aspect of the exemplary embodiments of the present invention, the semiconductor layer as an active layer is largely opened at the early stage of the manufacturing process and the first diffusion region is formed by using the resist mask in order to form the PN junction. Therefore, the surface is etched during the etching process for forming the opening, the step formed in the surface is reduced and the electrical field concentration is prevented.

As described above, since the impurity concentration in the diffusion region is well controlled by impurity diffusion as compared to the impurity concentration in an epitaxial layer, the deviation of the Zener voltage of the semiconductor device of the exemplary embodiments of the present invention is suppressed as compared to the deviation of the Zener voltage uniquely derived from the character of the semiconductor substrate. Also, since the uniformity in surface is improved, the wafer can be enlarged and the productivity is improved.

Also, as compared to the related art, it is not necessary to prepare semiconductor substrates, each of which includes epitaxial layer of different impurity concentration corresponding to the required Zener voltage. Therefore, the productivity is improved. As a result, there is a large impact on the productivity and the cost competency by virtue of the high yields and the small wafer stock.

BRIEF DESCRIPTION OF DRAWINGS

FIGS. 16A to 16E show manufacturing processes for the semiconductor device of the fifth exemplary embodiment.

DETAIL DESCRIPTION OF EXEMPLARY EMBODIMENTS

First Embodiment

A first exemplary embodiment of the present invention is explained below with reference to drawings.

Figure 1:
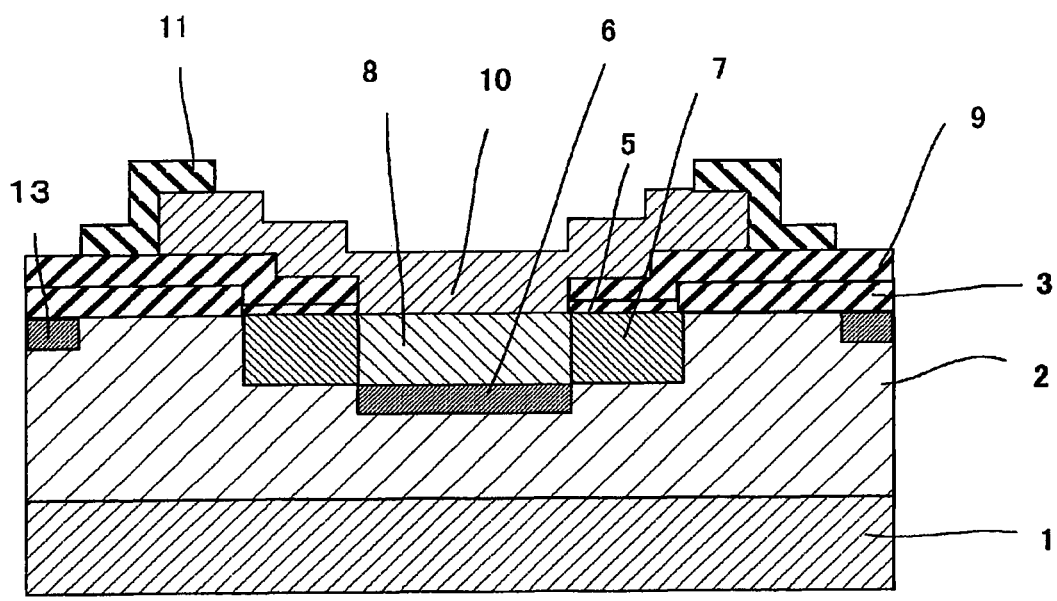
FIG. 1 is a cross sectional view of a semiconductor device according to the first exemplary embodiment.

FIG. 1 is a cross sectional view of a semiconductor device according to the first exemplary embodiment. FIGS. 2 to 5 show a manufacturing process for the semiconductor device. In FIGS. 2 to 5, same reference numbers respectively indicate corresponding objects.

The semiconductor device is a vertical type semiconductor device. In the semiconductor device, a N-type epitaxial layer 2 as a first type semiconductor layer is formed on a surface of the N++ type silicon substrate 1. The N-type epitaxial layer 2 is provided with a N-type diffusion region 6 as a diffusion region of a first conductive type and a P-type diffusion region 8 as a diffusion region of a second conductive type. The P-type diffusion region 8 partly overlaps the N-type diffusion region 6 and has a larger surface area than that of the N-type diffusion region 6. The P-type diffusion region 8 and the N-type diffusion region 6 forms a PN junction therebetween (Zener diode region). The residual portion of the P-type diffusion region 8 forms a ring shape structure 7. Also, an anode electrode 10 is formed on a surface of the Zener diode region. The anode electrode 10 is an aluminum film. The anode electrode 10 is partly covered by a protect layer 11 made from silicon nitride.

The N-type epitaxial layer 2 is provided with an insulator film 3. The insulator layer 3 has an opening on a surface thereof. The opening is self-aligned to a periphery of the ring shape structure 7. The P-type diffusion region 8 is formed by inverting the conductive type of the upper side of the N+ diffusion region 6. Although the P-type diffusion region 8 and the ring shaped structure 7 have a same impurity doping type, the PN junction between the P-type diffusion region 8 and the N-type diffusion region 6 has a smaller breakdown voltage than the junction between the ring shaped structure 7 and the N-type diffusion region 6. The reason is that the impurity concentration difference originated from the conductive type inversion of the P-type diffusion region 8.

In the first exemplary embodiment, the thickness of the N-type epitaxial layer 2 is 1~40 μm thickness and the impurity concentration of the N-type epitaxial layer 2 is 1E14~5E17 cm$^{-3}$. The insulator film 3 may be a CVD film made from $SiO_2$, nitride, or the like. The N+ diffusion region 6 is formed by ion implantation and drive diffusion of phosphorus. The depth and the impurity concentration of the N+ diffusion region 6 are 1 μm and 1E18~1E20 cm$^{-3}$ respectively. The P-type diffusion region 8 and the ring shaped structure 7 are formed simultaneously by ion implantation and drive-in diffusion of boron. The drive in diffusion is performed in a predetermined condition so as to precisely obtain an uniform concentration and depth. The depth and the impurity concentration of the P-type diffusion region 8 are 0.5 μm and 1E18~1E21 cm$^{-3}$ respectively. The depth and the impurity concentration of the ring shaped structure 7 are 0.3 μm and 1E18~1E21 cm$^{-3}$ respectively.

The ring shaped structure 7 relaxes the electric field of the silicon surface by surrounding the P-type diffusion layer 8. The breakdown voltage between the ring shaped structure 7 and the N-type epitaxial layer 2 is higher than that of PN junction between the P-type diffusion region 8 and the N-type epitaxial layer 2.

At the end of the N-type epitaxial layer 2, a channel stopper of same impurity concentration as that of the N+ diffusion region 6 is provided.

Next, a manufacturing method of the above described semiconductor device is explained below.

Figure 2A:
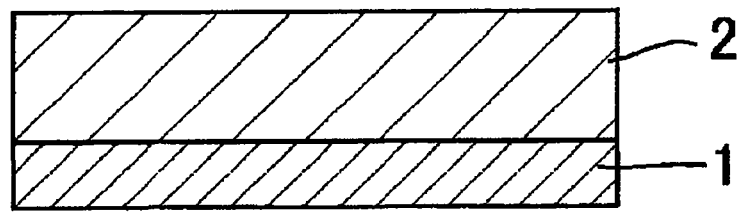
FIGS. 2A to 2D show manufacturing processes for the semiconductor device of the first exemplary embodiment.
Figure 2B:
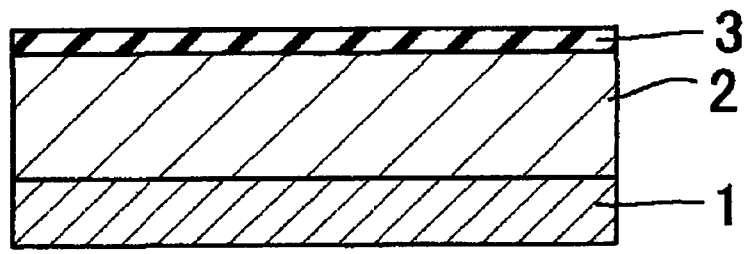
Figure 2C:
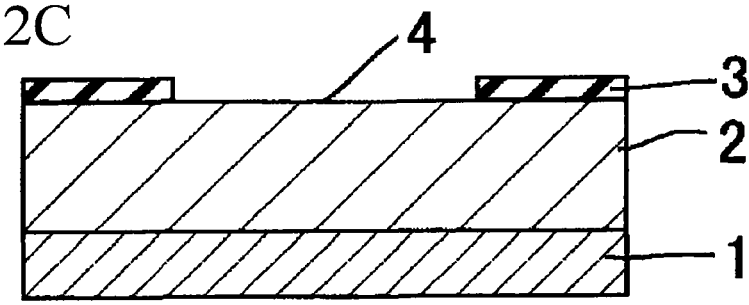
Figure 2D:
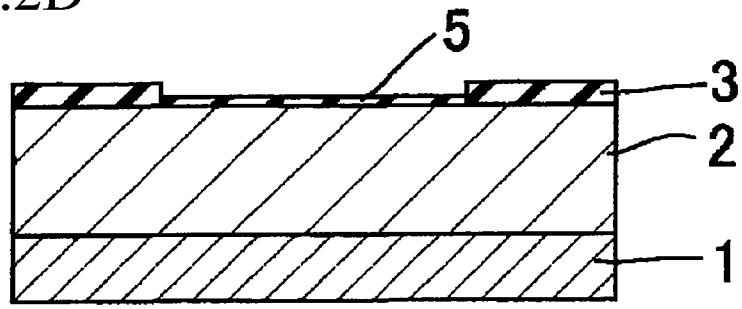

At first, as shown in FIG. 2A, a N/N++ epitaxial wafer is obtained by forming N-type epitaxial layer 2 on the surface of N++ silicon substrate 1. Second, as shown in FIG. 2B, the insulator layer 3 of silicon oxide film is formed on the surface of the N-type epitaxial layer 2 by thermal oxidation. Then, the opening 4 is formed at a predetermined position by photolithography (FIG. 2C). After that, as shown in FIG. 2D, the silicon oxide film 5 is formed on the surface of N-type epitaxial layer 2 which is exposed form the opening 4 by LOCOS (local oxidation of silicon).

Figure 3A:
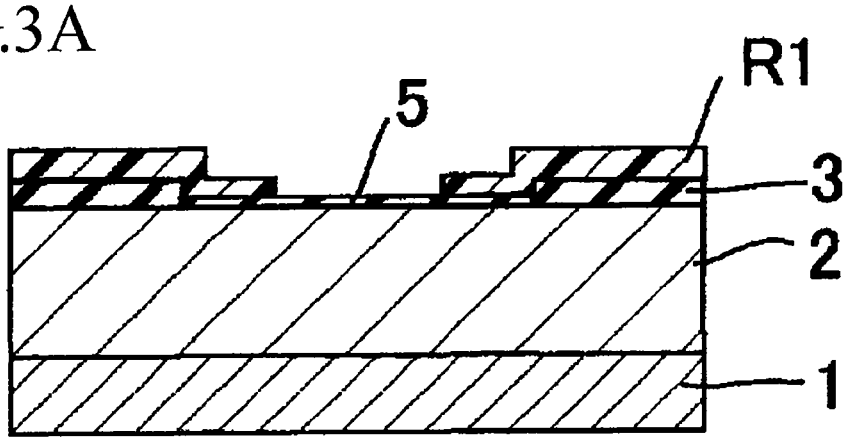
FIGS. 3A to 3C show manufacturing processes for the semiconductor device of the first exemplary embodiment.
Figure 3B:
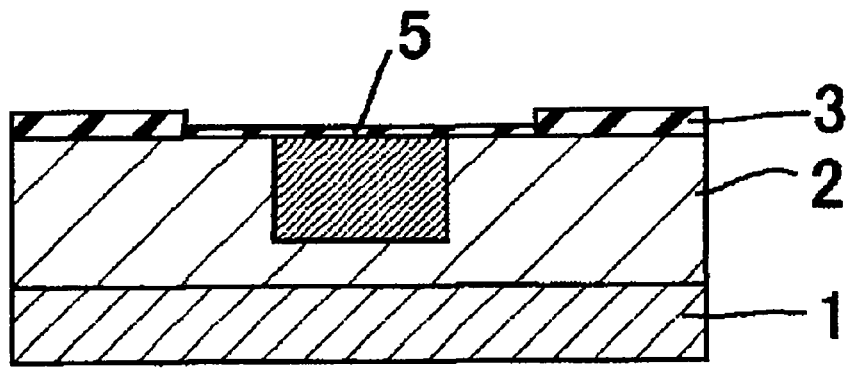

Next, as shown in FIG. 3A, photoresist is applied on the upper side of the silicon oxide films 3 and 5 so as to form a resist pattern R1 having an opening smaller than the opening 4. By using the resist pattern R1 as a mask, as shown in FIG. 3B, phosphorus is doped at 1E18~1E20 cm$^{-3}$ by ion implantation of phosphorus ion and drive diffusion. Then the resist pattern R1 is removed and N-type diffusion region 6 of low resistivity is formed. The impurity concentration of the N-type diffusion region 6 is set so that the resistivity of the N-type diffusion region 6 is enough smaller than that of the N-type epitaxial layer 2. Therefore, the resistivity deviation in the N-type epitaxial layer 2 can be negligible.

Figure 3C:
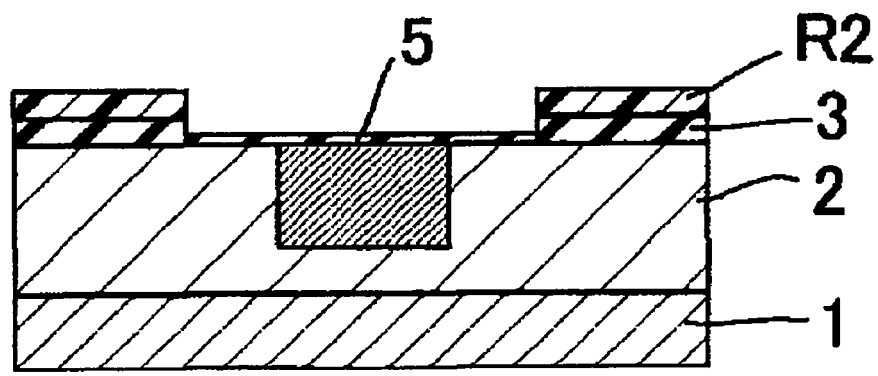
Figure 4A:
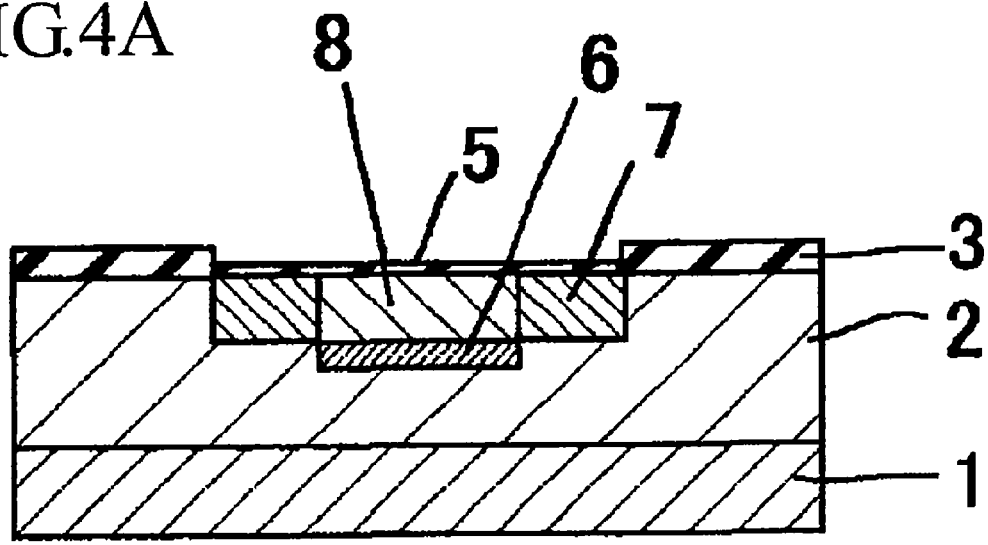
FIGS. 4A to 4B show manufacturing processes for the semiconductor device of the first exemplary embodiment.

Next, as shown in FIG. 3C, photoresist is applied on the upper side of the silicon oxide films 3 and 5 so as to form a resist pattern R2 having an opening same in size as the opening 4. By using the resist pattern R2 as a mask, boron is doped at 1E18~1E21 cm$^{-3}$ by ion implantation of boron ion and drive diffusion in nitrogen atmosphere so as to invert the conductive type at the upper portion of the N-type diffusion region 6. The P-type diffusion region 6 is completed after the resist pattern R2 is removed. At the same time, the ring shaped structure 7 is formed so as to surround the P-type diffusion region 6 (FIG. 4A).

Thus, the PN junction is obtained between the N-type diffusion region 6 and the P-type diffusion region 8. The PN junction (a region where the N-type diffusion region 6 and the P-type region 8 touch each other) has a breakdown voltage smaller than that of a peripheral region thereof, since PN junction is formed from the N-type diffusion region 6 and the P-type diffusion region 8 rather than the P-type diffusion region 8 and the N-type epitaxial layer 2.

In this embodiment, the breakdown voltage of the PN junction (main breakdown voltage) is 6V to 60V. On the other hand, the breakdown voltage of the peripheral region (peripheral breakdown voltage) is 8V to 100V. Thus, PN junction between the N-type diffusion region 6 and the P-type diffusion region 8 surely causes its breakdown before the peripheral region. Accordingly, when the PN junction acts as a Zener diode, the inverse current flow the PN junction but does not flow the peripheral region.

As described above, since the impurity concentration of the N-type diffusion region 6 is enough larger than that of the N-type epitaxial layer 2, the deviation of impurity concentration in the N-type epitaxial layer 2 is negligible. Also, the breakdown voltage is determined by the impurity concentrations in the N-type diffusion region 6 and the P-type diffusion region 8. Therefore, even if there is a deviation in resistivity of used wafer, the breakdown voltage of thus obtained PN junction does not deviate from required value. Thus a semiconductor device with small deviation in its breakdown voltage is obtained.

Figure 4B:
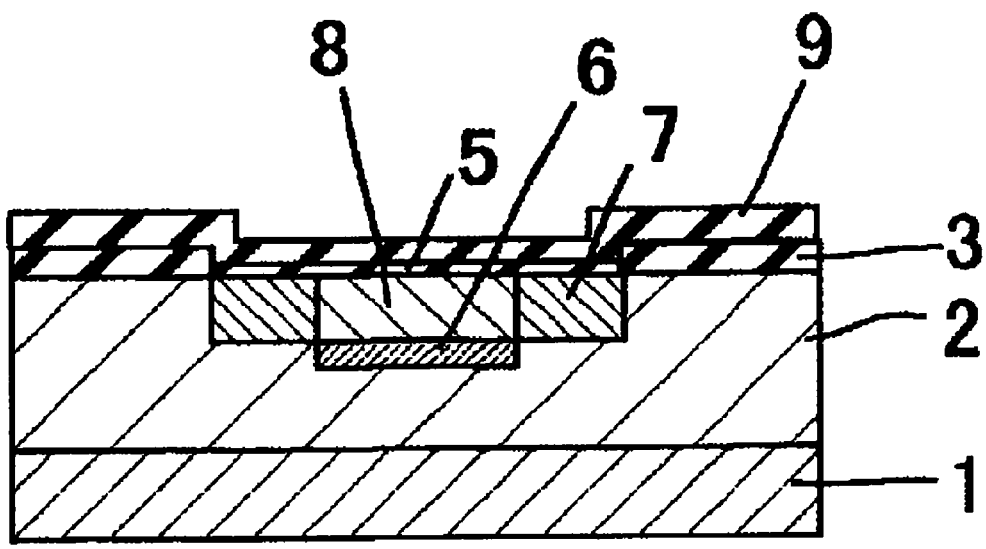

After forming the PN junction, as shown in FIG. 4B, the upper insulator layer 9 is formed by forming LT-TEOS (TetraEthOxySilane) and applying BPSG (Boron Phosphor Silicate Glass).

Figure 5A:
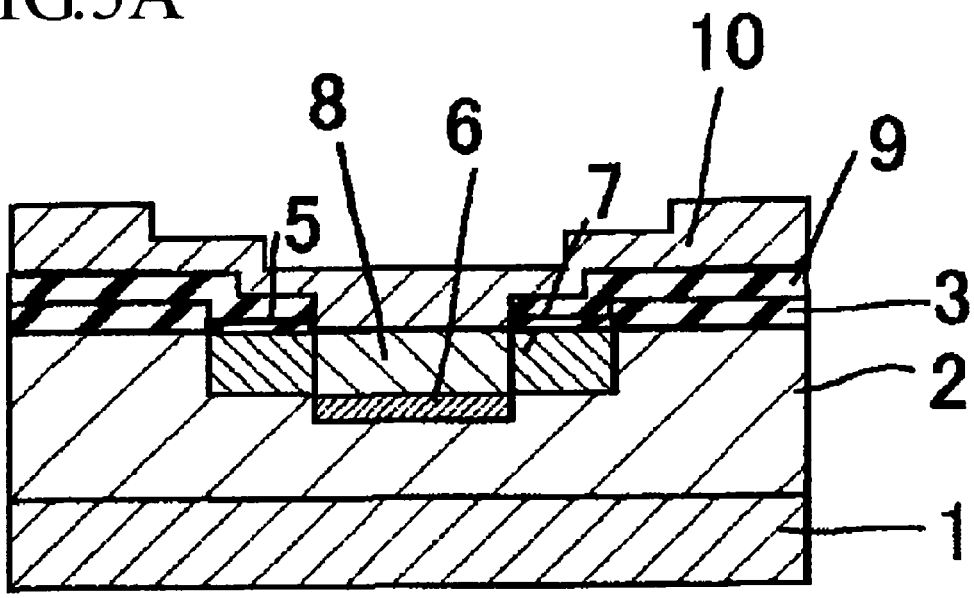
FIGS. 5A to 5B show manufacturing processes for the semiconductor device of the first exemplary embodiment.
Figure 5B:
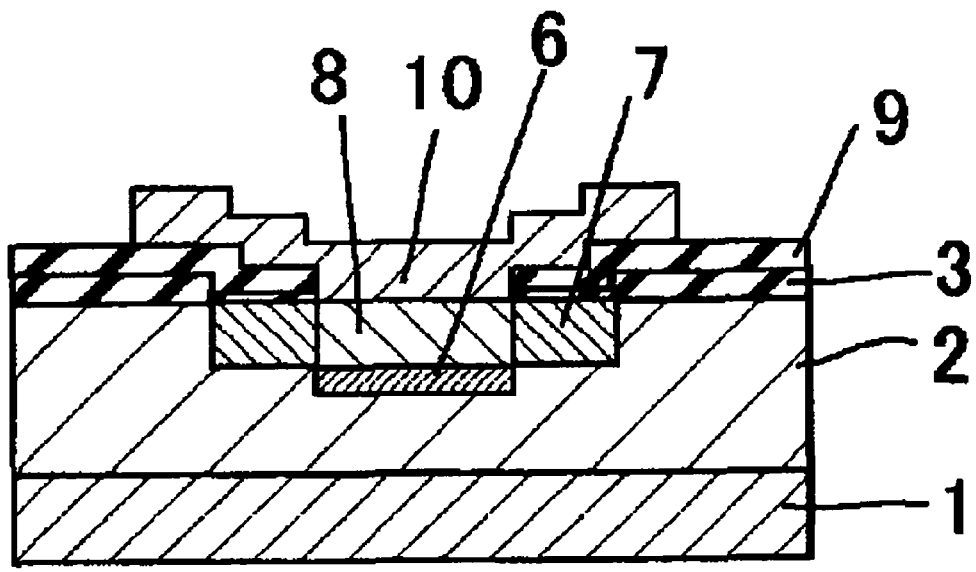

After that, as shown in FIG. 5A, photoresist is applied so as to form a resist pattern having an opening for contact. By using the resist pattern as a mask, an opening for contact is formed on the upper insulator layer 9. Then, as shown in FIG. 5B, the anode electrode 10 made from an aluminum film is formed. Thus, the semiconductor device described in FIG. 1 is completed.

It should be noted that the controllability of Zener voltage is an important manufacturing parameter since Zener diode is precisely categorized (classified, or ranked) by Zener voltage thereof, mainly in the range of 2V to 50V.

In the configuration of the above described first exemplary embodiment, the breakdown voltage (Zener voltage) of the PN junction can be set large by reducing the impurity concentration of the P-type diffusion region 8. Thus, the required Zener voltage is easily obtained.

The required Zener voltage is obtained in good precision because the impurity concentration can be precisely controlled by ion implantation and drive diffusion. As a result, the manufacturing yield is improved and a semiconductor device is provided at low cost.

According to the above described first exemplary embodiment, since the Zener voltage is determined by the impurity concentration of the P-type diffusion region relative to the N-type diffusion region without any effects derived from the impurity concentration (resistivity) of the semiconductor substrate, it is possible to provide a semiconductor device having the required Zener characteristics with good controllability. Also, since the N-type diffusion region is formed by impurity doping, it is not necessary to prepare many kinds of wafers in stock. Thus, productivity is improved.

Also, a large opening is formed on the insulator layer at first stage of manufacturing process, there is no step at the peripheral region. In a case where there is a step on the surface, the N-type diffusion region and P-type diffusion region has a step derived from the impurity profile. At such a step, the electric field tends to concentrate. According to the first exemplary embodiment, since the impurity profile does not have any step, the depletion layer well extends and there is no overlap of the electric field and the electric field concentration. Thus, a good current-voltage characteristic is obtained.

Second Embodiment

A second exemplary embodiment of the present invention is explained below.

Figure 6:
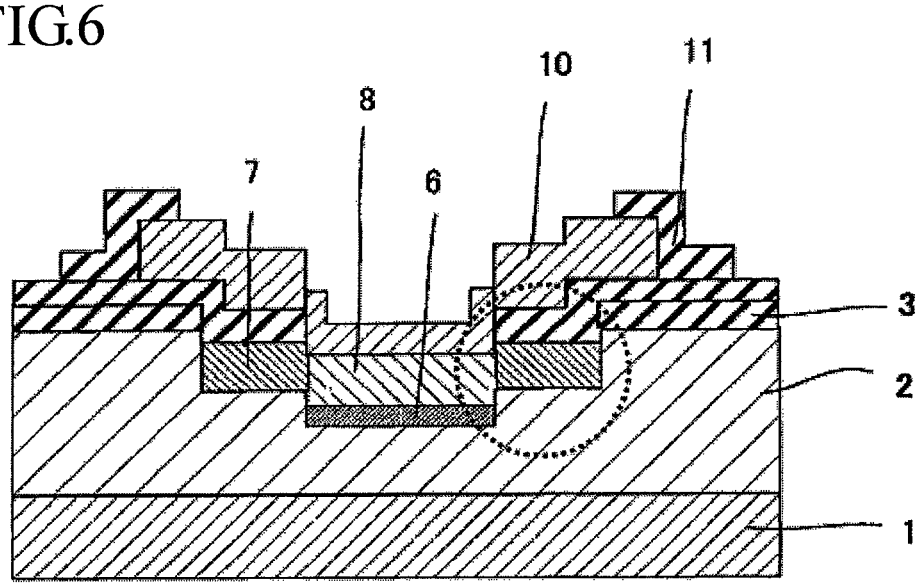
FIG. 6 is a cross sectional view of a semiconductor device according to the second exemplary embodiment.

FIG. 6 is a cross sectional view of a semiconductor device of the second exemplary embodiment. FIGS. 7A to 9B show a manufacturing process for the semiconductor device. In FIGS. 6, 7A to 9B, same reference numbers respectively indicate corresponding objects in FIGS. 1 to 5B and explanations for them are omitted.

In the first exemplary embodiment, when the insulator layer 3 is patterned, a large opening is provided so as to expose the N+ epitaxial layer 2 therefrom. Also, in the first exemplary embodiment, when the N-type diffusion region 6 is formed for forming the PN junction, a resist mask is used. On the other hand, in the second exemplary embodiment, necessary openings are formed in order. Thus, the number of photolithography is reduced and the step on the surface is reduced.

The semiconductor device according to the second exemplary embodiment differs from the first exemplary embodiment in the point that there is a step on the surface (circled in FIG. 6). Therefore, the PN junction between the P-type diffusion layer 8 and the N-type diffusion layer 6 is deeper than the bottom of the ring shaped structure 7 in an amount corresponding to the height of the step. According to this configuration, since the leak current is reduced, the reliability of the semiconductor device is improved.

Next, the manufacturing method for the semiconductor device according to the second embodiment is explained below.

Figure 7A:
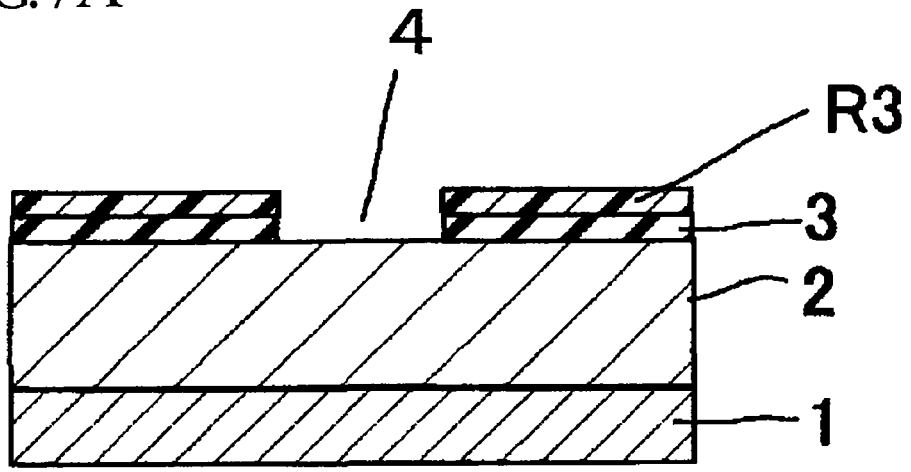
FIGS. 7A to 7C show manufacturing processes for the semiconductor device of the second exemplary embodiment.

Firstly, as shown in FIGS. 2A and 2B, a N-type epitaxial layer 2 is formed on a surface of a N++-type silicon substrate. Thus, a N−/N++ epitaxial wafer is obtained. An insulator layer 3 of the silicon oxide film is formed on the surface of the N−/N++ epitaxial wafer by thermal oxidation. Then, as shown in FIG. 7A, a resist pattern R3 is formed by photolithography. By using the resist pattern R3 as a mask, an opening 4 is formed at a predetermined position by dry etching. During the dry etching, a region of the N-type epitaxial layer 2 corresponding to the opening 4 is also etched about 20 nm in depth. The opening 4 has a size suitable for forming the first diffusion region.

Figure 7B:
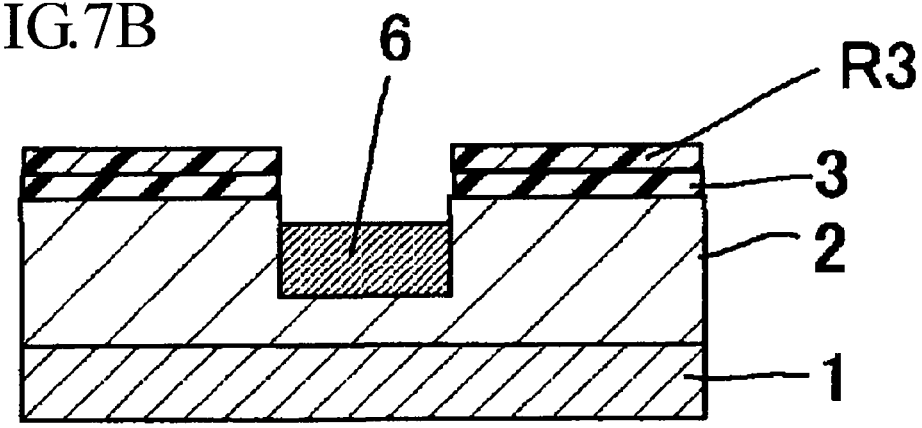

By using the resist pattern R3 as a mask, as shown in FIG. 7B, the N-type epitaxial layer 2 is doped by phosphorus ion at $1E18 \sim 1E20$ $cm^{-3}$ by ion implantation and drive diffusion. Thus, the N-type diffusion region 6 with small resistivity is formed. Because of the dry etching, the N-type diffusion region 6 recesses from the upper surface of the N-type epitaxial layer 2.

At this stage, the impurity concentration of the N-type diffusion region 6 is enough higher than that of N-type epitaxial layer 2 so that the deviation in the impurity concentration of the N-type epitaxial layer is negligible.

Figure 7C:
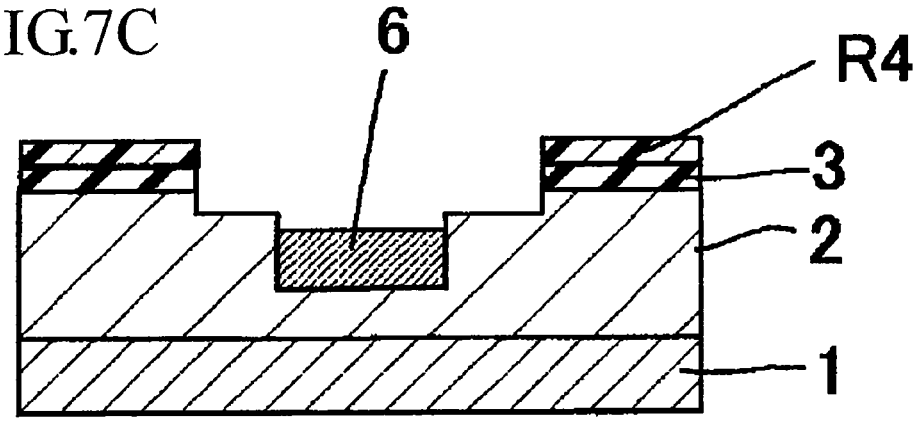

Then, a photoresist is applied on the upper side of the silicon oxide film 3 so as to form a resist pattern R4 having an opening 24 larger than the opening 4. By using the resist pattern R4 as a mask, the silicon oxide film 3 is patterned by dry etching (FIG. 7C). During the dry etching, a region of the N-type epitaxial layer 2 corresponding to the opening 24 is also etched about 20 nm.

Figure 8A:
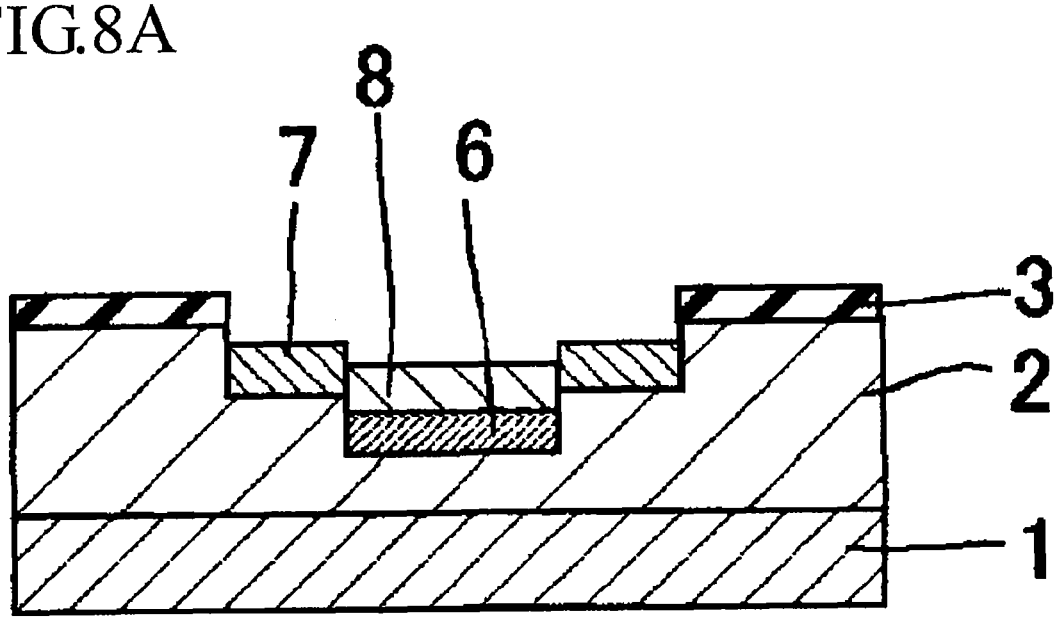
FIGS. 8A to 8B show manufacturing processes for the semiconductor device of the second exemplary embodiment.

By using the resist pattern R4 and the silicon oxide film 3 as a mask, N-type epitaxial layer 2 is doped by boron ion at $1E18 \sim 1E21$ $cm^{-3}$ with ion implantation and drive diffusion in nitrogen atmosphere so as to invert the conductive type at the upper portion of the N-type diffusion region 6. The P-type diffusion region 6 is completed after the resist pattern R2 is removed (as shown in FIG. 8A). At the same time, the ring shaped structure 7 is formed so as to surround the P-type diffusion region 6. During this process, it is possible to prevent the P-type diffusion region 6 from being formed deeper than the N-type diffusion region 6 by forming LP-TEOS prior to the boron ion implantation. Because of the dry etching, the N-type diffusion region 6 recesses from the upper surface of the N-type epitaxial layer 2 about 40 nm, and the P-type diffusion region 8 recesses from the upper surface of the N-type epitaxial layer 2 about 20 nm. Thus, steps are formed.

Thus, the PN junction is obtained between the N-type diffusion region 6 and the P-type diffusion region 8. The PN junction (a region where the N-type diffusion region 6 and the P-type region 8 touch each other) has a breakdown voltage smaller than that of a peripheral region thereof, since the PN junction is formed from the N-type diffusion region 6 and the P-type diffusion region 8 rather than the P-type diffusion region 8 and the N-type epitaxial layer 2. Accordingly, when the PN junction acts as a Zener diode, the inverse current flow the PN junction but does not flow the peripheral region.

As described above, since the impurity concentration of the N-type diffusion region 6 is enough larger than that of the N-type epitaxial layer 2, the deviation of impurity concentration in the N-type epitaxial layer 2 is negligible. Also, the breakdown voltage is determined by the impurity concentrations in the N-type diffusion region 6 and the P-type diffusion region 8. Therefore, even if there is a deviation in resistivity of used wafer, the breakdown voltage of thus obtained PN junction does not deviate from required value. Thus a semiconductor device with small deviation in its breakdown voltage is obtained.

Figure 8B:
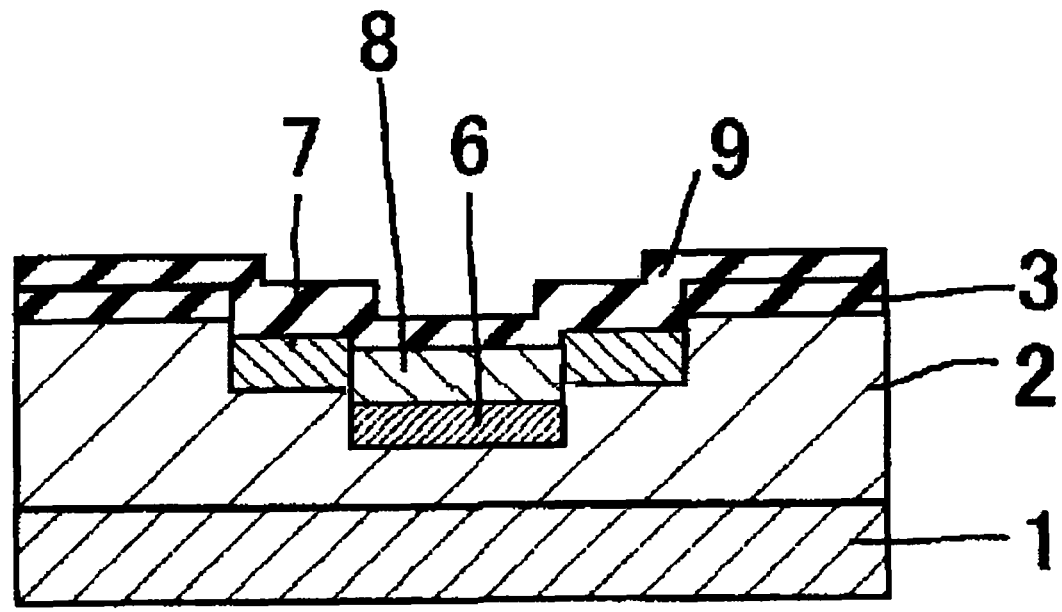

After the PN junction is formed, as shown in FIG. 8B, an upper insulator layer 9 is formed by forming LP-TEOS and BPSG growth.

Figure 9A:
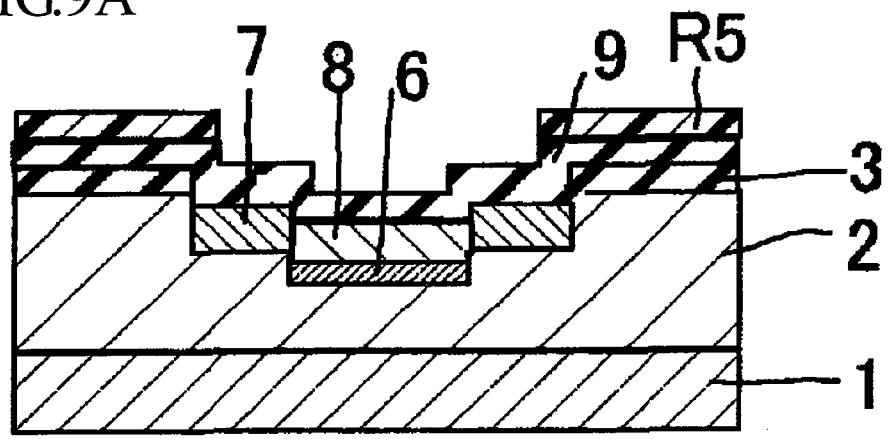
FIGS. 9A to 9B show manufacturing processes for the semiconductor device of the first exemplary embodiment.
Figure 9B:
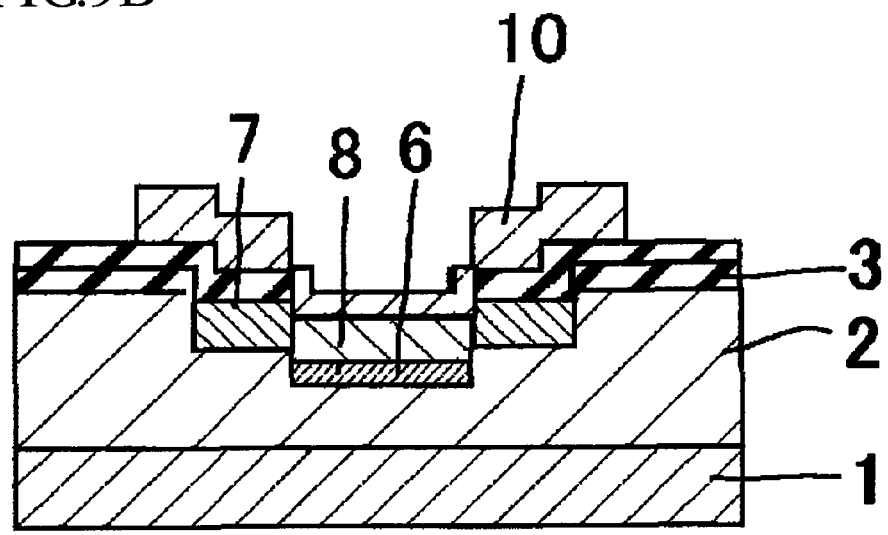

After that, as shown in FIG. 9A, photoresist is applied so as to form a resist pattern R5 having an opening for contact. By using the resist pattern R5 as a mask, an opening for contact is formed on the upper insulator layer 9. Then, as shown in FIG. 9B, the anode electrode 10 made from an aluminum film or a gold film, on which solder bonding is possible, is formed. Then, a protect layer 11 made from a silicon nitride film is formed on the upper side of the anode electrode 10.

In this embodiment, it is possible to increase the breakdown voltage (Zener voltage) of the PN junction by reducing the impurity concentration of the P-type diffusion region 8. The required Zener voltage is obtained in good precision because the impurity concentration can be precisely controlled by ion implantation and drive diffusion. As a result, the manufacturing yield is improved and a semiconductor device is provided at a low price.

Third Embodiment

Figure 10:
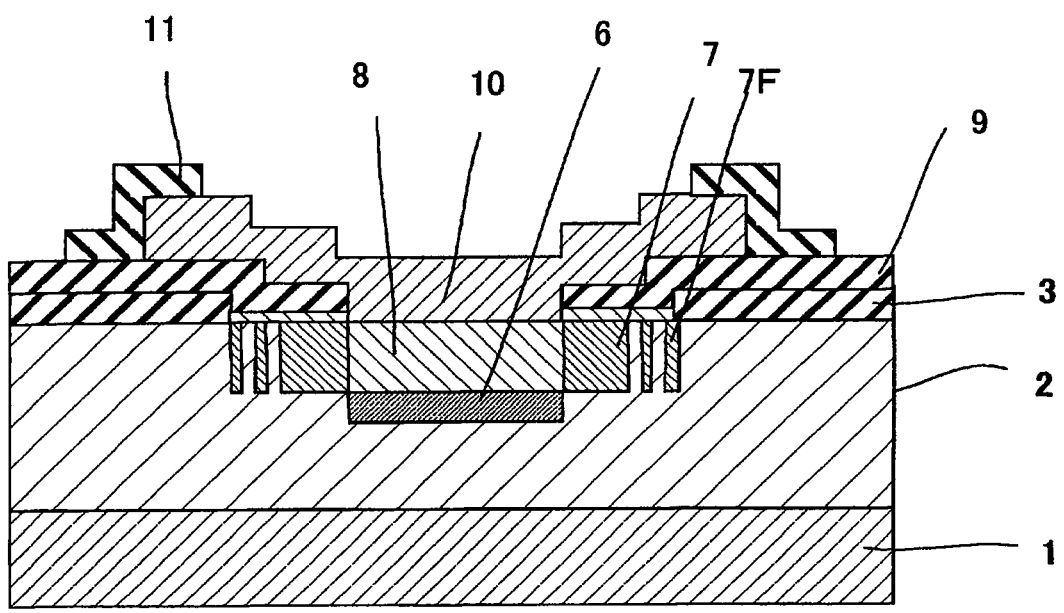
FIG. 10 is a cross sectional view of a semiconductor device according to the third exemplary embodiment.
Figure 11:
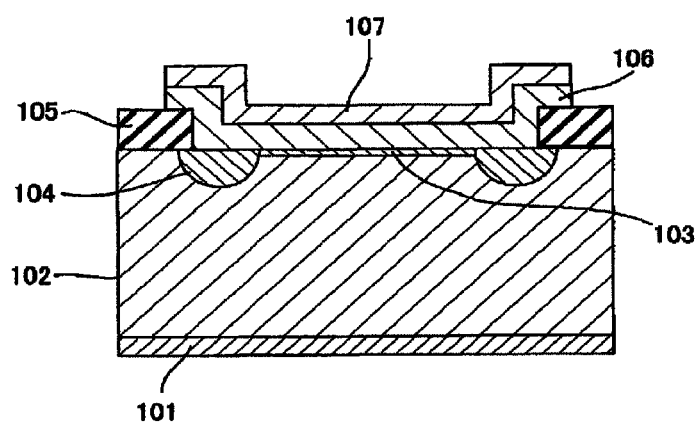
FIG. 11 is a cross sectional view of a related semiconductor device.

Next, a third exemplary embodiment of the present invention is explained here. In the previous embodiments, the ring shape structure 7 is formed. In the third exemplary embodiment, a FLR (Field Limiting Ring) 7F is formed about the ring shaped structure 7 as shown in FIG. 10. In this case, the FLR 7F is formed simultaneously with the ring shaped structure 7 and the P-type diffusion region 8. Since the FLR 7F is one or plurality of P-type layers which surround the P-type diffusion region 8 and relaxes the electrical field on the surface of the silicon substrate, the breakdown voltage between the ring shaped structure 7 and the N-type epitaxial layer 2 (the peripheral voltage) is high relative to the first and the second embodiments. From a point of view of manufacturing, the FLR 7F is easily formed since the FLR 7F requires only modification of the mask in order to form the P-type layers corresponding to the FLR 7F. As same as other embodiments, the third embodiment provides a Zener diode whose Zener voltage is easily controlled. Especially, the third embodiment is effective for the case the Zener voltage more than 7 is required.

Fourth Embodiment

Figure 12:
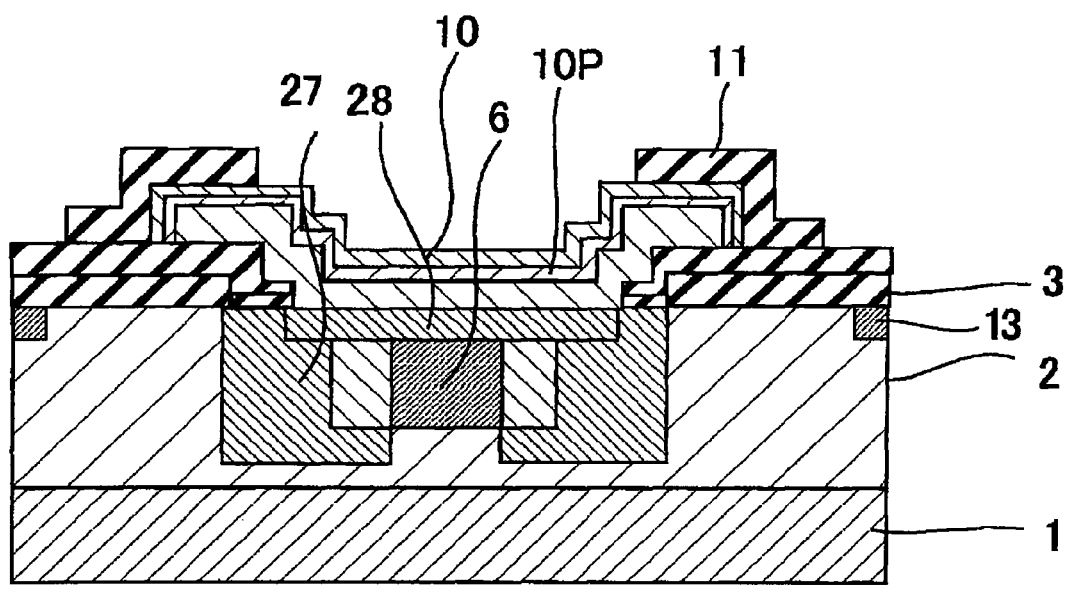
FIG. 12 is a cross sectional view of a semiconductor device of the fourth exemplary embodiment.

Next, a fourth exemplary embodiment of the present invention is explained below with reference to the drawings. FIG. 12 is a cross sectional view of the semiconductor device according to the fourth exemplary embodiment, FIGS. 13A to 13D and FIGS. 14A to 14B show a manufacturing process for the semiconductor device according to the fourth exemplary embodiment. In the FIGS. 13A to 13D and FIGS. 14A to 14B, the same elements are assigned the same reference number and explanations are omitted.

The semiconductor device is a vertical type semiconductor device. In the semiconductor device, a N-type epitaxial layer 2 as a first type semiconductor layer is formed on a surface of the N++ type silicon substrate 1. The N-type epitaxial layer 2 is provided with a N-type diffusion region 6 as a diffusion region of a first conductive type and a highly doped P-type diffusion region 28 as a highly doped diffusion region of a second conductive type. The highly doped P-type diffusion region 28 partly overlaps the N-type diffusion region 6 and has a larger surface area than that of the N-type diffusion region 6. The highly doped P-type diffusion region 28 and the N-type diffusion region 6 form a PN junction therebetween (Zener diode region). The N-type epitaxial layer 2 is also provided with a guard ring 27 of P-type conductive type. The guard ring 27 has a ring shape and surrounds the PN junction. Also, an anode electrode 10 is formed on a surface of the Zener diode region. The anode electrode 10 is an aluminum film. The anode electrode 10 is partly covered by a protect layer 11 made from silicon nitride.

The N-type epitaxial layer 2 is provided with an insulator film 3. The insulator layer 3 has an opening on a surface thereof. The opening is self-aligned to a periphery of the guard ring 27 and is formed prior to forming the N-type diffusion region 6. The highly doped P-type diffusion region 28 is formed by inverting the conductive type of the upper side of the N+ diffusion region 6. Although the highly doped P-type diffusion region 28 and the guard ring 27 are based on same impurity doping type, the PN junction between the highly doped P-type diffusion region 28 and the N+-type diffusion region 6 has a smaller breakdown voltage than the junction between the guard ring 27 and the N+-type diffusion region 6. The reason is that the impurity concentration in the highly doped P-type diffusion region 28 is higher than that of the guard ring 27. The highly doped P-type diffusion region 28 is a shallow diffusion region with very high impurity concentration. In this embodiment, the PN junction has a breakdown voltage smaller than 7V.

In the fourth exemplary embodiment, the silicon substrate 1 is N++ type and the N-type epitaxial layer 2 is an epitaxial layer of 1~40 μm thickness. The impurity concentration of the N-type epitaxial layer 2 is $1E14~5E17$ cm$^{-3}$. The insulator film 3 may be a CVD film made from SiO$_2$ or nitride. The N+ diffusion region 6 is formed by ion implantation and drive diffusion of phosphorus. The depth and the impurity concentration of the N+ diffusion region 6 are 0.2~0.7 μm and $1E18~1E20$ cm$^{-3}$ respectively. The highly doped P-type diffusion region 28 is formed after the guard ring 27 is formed. Both of the highly doped P-type diffusion region 28 and the guard ring 27 are formed by ion implantation of boron ion and drive-in diffusion of the doped boron so as to precisely obtain a uniform concentration and doping depth respectively. The depth and the impurity concentration of the highly doped P-type diffusion region 28 are 500 nm and $1E18~1E21$ cm$^{-3}$ respectively. The depth and the impurity concentration of the guard ring 27 are 0.8~1.6 μm and $1E18~1E21$ cm$^{-3}$ respectively.

In this embodiment, the guard ring 27 and the highly doped P-type diffusion region 28 are formed by forming a relatively large opening 4 prior to form resist patterns used as masks. This manufacturing process prevents a recess from being formed on the surface of the substrate by etching. Thus, the ion implantation is performed on a flat surface without steps. Since the surface of the guard ring 27 and the highly doped P-type region 28 are thus flat, the electric field in the surface is relaxed. Therefore, the breakdown voltage between the guard ring 27 and the N-type epitaxial layer 2 is higher than that of the PN junction between the highly doped P-type diffusion region 28 and N-type epitaxial layer 2.

At the end of the N-type epitaxial layer 2, a channel stopper 13 of same impurity concentration as that of the N+ diffusion region 6 is provided.

Next, a manufacturing method for the semiconductor device according to the fourth embodiment is explained below. Processes prior to the process of FIG. 13A (processes to form the N-type diffusion region 6) are similar to those of the exemplary embodiment 1.

Figure 13A:
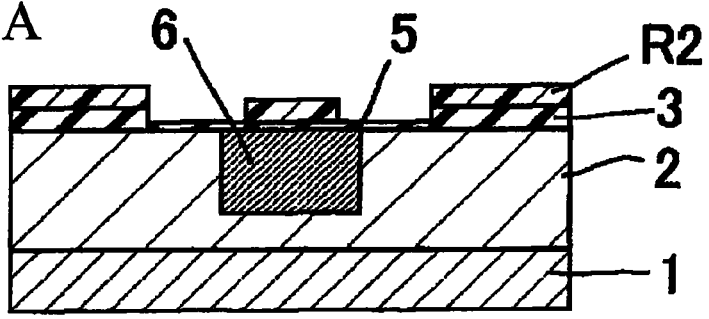
FIGS. 13A to 13D show manufacturing processes for the semiconductor device of the fourth exemplary embodiment.
Figure 13B:
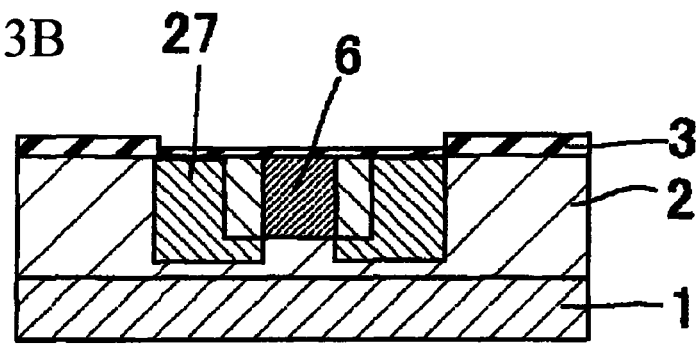

As shown in FIG. 13A, a resist pattern R2 is formed on the upper surface of the insulator layer 3. In order to form the guard ring, boron ions are doped at $1E20$ $cm^{-3}$ in the N-type epitaxial layer 2 by ion implantation and drive diffusion in nitrogen atmosphere so as to invert the conductive type at the peripheral portion of the N-type diffusion region 6. At this stage, the boron is doped deeper than the N-type diffusion region 6. After the resist pattern R2 is removed, the ring shaped guard ring 27 is completed (FIG. 13B).

Figure 13C:
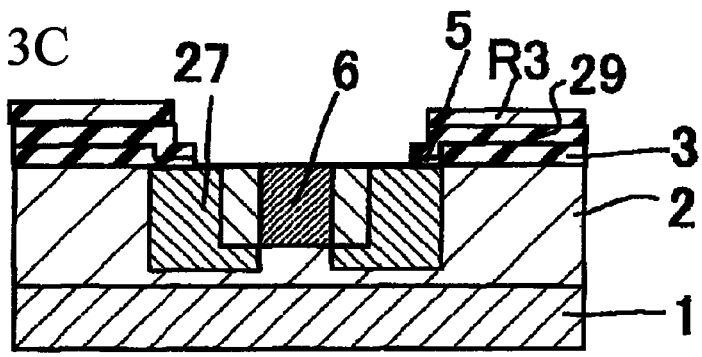

Then, as shown in FIG. 13C, a silicon oxide layer 29 is formed by CVD method after removing the resist pattern R2. A resist pattern R3 is formed on the silicon oxide layer 29. By using the resist pattern R3 as a mask, the silicon oxide layer 29 is etched so as to form an opening for anode contact on the surface thereof.

Figure 13D:
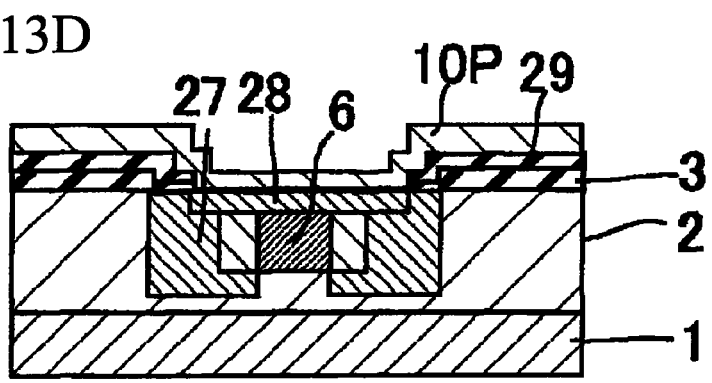

After the opening is formed, as shown in FIG. 13D, a poly-silicon layer 10P including boron is formed on the upper surface. Then, the shallow highly doped diffusion region (the highly doped P-type diffusion region 28) is formed by thermal diffusion of boron into the upper portion of the guard ring 27 and the N-type diffusion layer 6. The conductive type of the upper portion of the N-type diffusion layer 6 is thus inverted.

Thus, the PN junction is obtained between the N-type diffusion region 6 and the highly doped P-type diffusion region 28. The PN junction (a region where the N-type diffusion region 6 and the highly doped P-type region 28 touch each other) has a breakdown voltage smaller than that of peripheral region thereof, since PN junction is formed from the N-type diffusion region 6 and the highly doped P-type diffusion region 28 rather than the highly doped P-type diffusion region 28 and the N-type epitaxial layer 2.

In this embodiment, the breakdown voltage of the PN junction (main breakdown voltage) is 3V to 10V. On the other hand, the breakdown voltage of the peripheral region (peripheral breakdown voltage) is 5V to 20V. Thus, PN junction between the N-type diffusion region 6 and the highly doped P-type diffusion region 28 surely causes its breakdown before the peripheral region.

Accordingly, when the PN junction acts as a Zener diode, the inverse current flow the PN junction but does not flow the peripheral region. Therefore, even if there is a deviation in resistivity of used wafer, the breakdown voltage of thus obtained PN junction does not deviate from required value. Thus a semiconductor device with small deviation in its breakdown voltage is obtained.

Figure 14A:
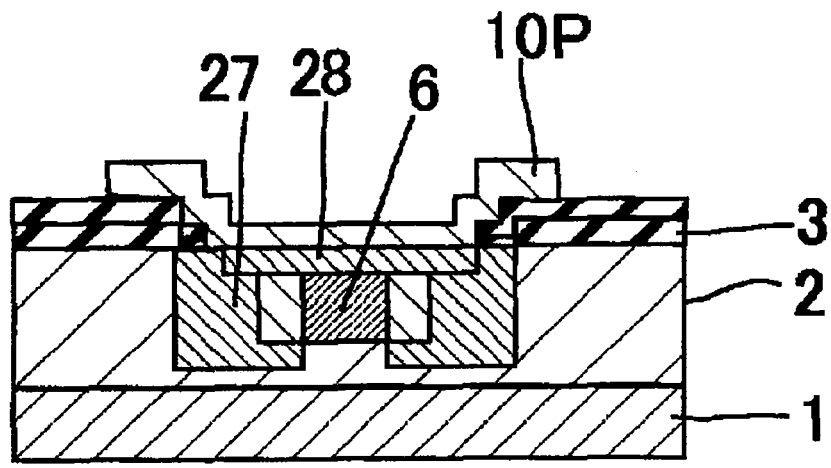
FIGS. 14A to 14B show manufacturing processes for the semiconductor device of the fourth exemplary embodiment.
Figure 14B:
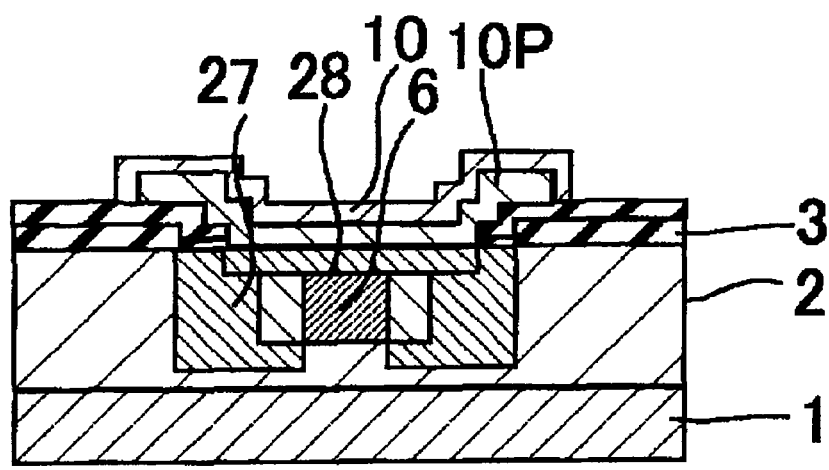

After that, as shown in FIG. 14A, the poly-silicon layer 10P is patterned. Then, as shown in FIG. 14B, the anode electrode 10 of aluminum film is formed. Finally, the protection layer 11 of silicon nitride film is formed over the part of the anode electrode 10. Thus, the semiconductor device described in FIG. 12 is completed.

In the configuration of the above described fourth exemplary embodiment, the breakdown voltage (Zener voltage) of the PN junction can be set large by increasing the impurity concentration of the high doped P-type diffusion region 28 and making the high doped P-type diffusion region 28 more shallow. Thus, the required Zener voltage is easily obtained.

The required Zener voltage is obtained in good precision because the impurity concentration can be precisely controlled by ion implantation, drive diffusion, and thermal shallow diffusion from poly-silicon layer. As a result, the manufacturing yield is improved and a semiconductor device is provided at a low price.

According to the above described fourth exemplary embodiment, since the Zener voltage is determined by the impurity concentration of the high doped P-type diffusion region 28 relative to the N-type diffusion region 6 without any effects derived from the impurity concentration (resistivity) of the semiconductor substrate, it is possible to provide a semiconductor device having the required Zener characteristics with good controllability. Also, since the N-type diffusion region is formed by impurity doping, it is not necessary to prepare many kinds of wafers in stock. Thus, productivity is improved.

Also, a large opening is formed on the insulator layer at first stage of manufacturing process, there is no step at the peripheral region. In a case where there is a step on the surface, the N-type diffusion region 6 and high doped P-type diffusion region 28 has a step derived from the impurity profile. At such a step, the electric field tends to concentrate. According to the fourth exemplary embodiment, since the impurity profile does not have any step, the depletion layer well extends and no overlap of the electric field prevents the electric field concentration. Thus, a good current-voltage characteristic is obtained.

Fifth Embodiment

Figure 15:
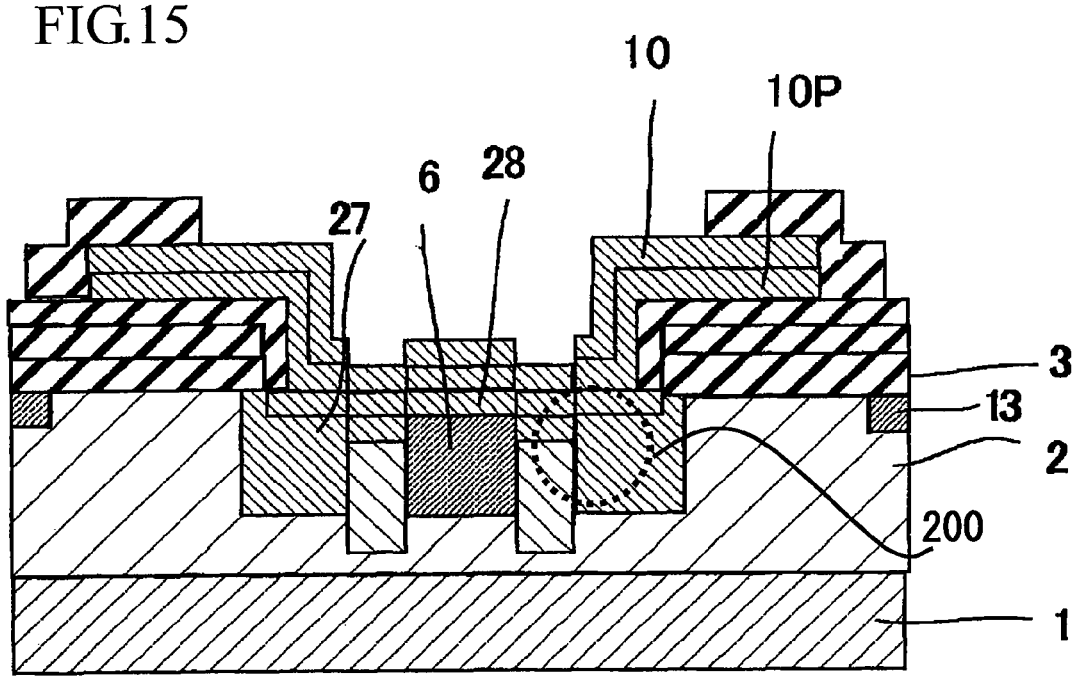
FIG. 15 is a cross sectional view of the fifth exemplary embodiment.

Next, the fifth exemplary embodiment of the present invention is explained below. FIG. 15 is a cross-sectional view of a semiconductor device according to the fifth exemplary embodiment. FIGS. 16A to 17B show the manufacturing process for the semiconductor device. In the FIGS. 16A to 17B and FIG. 15, the same elements are assigned the same reference number and explanations are omitted.

In the fourth exemplary embodiment, when the insulator layer 3 is patterned, a large opening is provided so as to expose the N+ epitaxial layer 2 therefrom. Also, in the fourth exemplary embodiment, when the N-type diffusion region 6 is formed for forming the PN junction, a resist mask is used. On the other hand, in the fifth exemplary embodiment, necessary openings are formed in order. Thus, the number of photolithography is reduced and the step on the surface is reduced.

The semiconductor device structure of the fifth exemplary embodiment differs from the fourth exemplary embodiment in the point that there is a step 200 on the surface (circled in FIG. 15). According to this configuration, since the leak current is reduced, the reliability of the semiconductor device is improved.

Next, the manufacturing process for the semiconductor device according to the fifth exemplary embodiment is explained below.

Figure 16A:
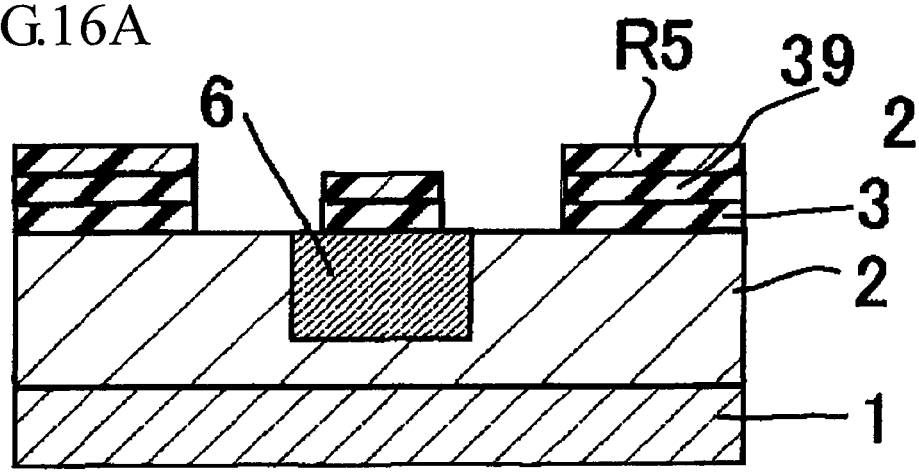

After forming N type diffusion region 6, as shown in FIG. 16A, the oxide silicon layer 3 is patterned in a donut shape.

Figure 16B:
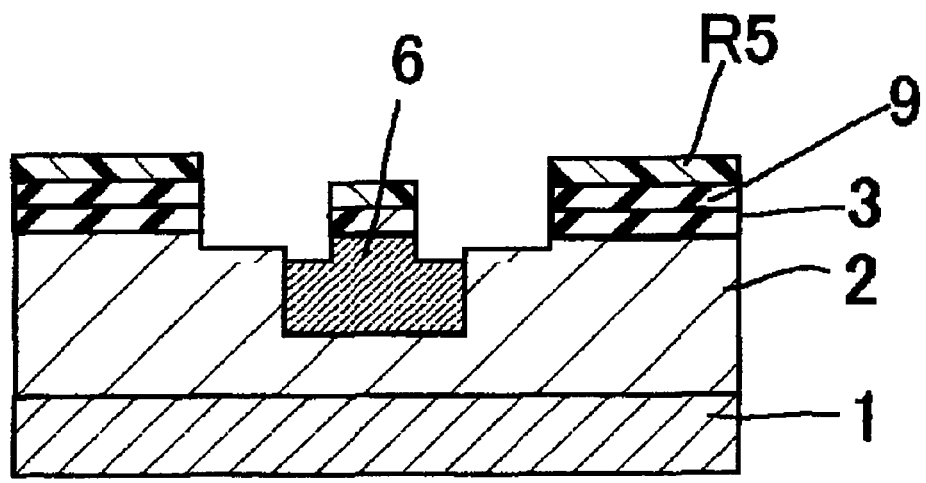

The patterning of the oxide silicon layer 3 is performed by using the donut shaped resist pattern R5 which is formed on the LP-TEOS layer 39 provided on the silicon oxide layer 3. The upper portion of the N+ epitaxial layer 2 (a portion of the N+ epitaxial layer 2 not covered by the resist pattern R5) is covered by the LP-TEOS layer 39 and the silicon oxide layer 3. On the other hand, the upper peripheral portion of the N type diffusion region 6 (a portion of the N type diffusion region 6 not covered by the resist pattern R5) is covered by LP-TEOS layer 39. Therefore, once the silicon oxide layer 3 and the LP-TEOS layer 39, which cover the upper portion of the N+ epitaxial layer 2, are etched, the upper portion of the N type diffusion region 6 is also etched by same amount as the silicon oxide layer 3. Thus a step 200 (recess) is formed at the upper peripheral portion of the N type diffusion region 6. In this embodiment, since the upper portion of the N+ epitaxial layer 2 is etched by 20 nm and the upper peripheral portion of the N type diffusion layer 6 is etched by 40 nm, the height of the step 200 is 20 nm. (FIG. 16B)

As shown in FIG. 16C, by using the resist pattern R5 and the silicon oxide layer 3 as a mask, boron ion is implanted by ion implantation and drive diffusion in nitrogen atmosphere at $1E18 \sim 5E22$ cm$^{-3}$ so as to invert the conductive type of the N type diffusion region 6 and the N+ epitaxial layer 2. Then, the guard ring 27 of P conductive type is obtained after removing the resist pattern R5. At this stage, the guard ring 27 is prevented from penetrating the N+ type epitaxial layer 2 by forming LP-TEOS layer prior to the boron ion implantation.

As shown in FIG. 16D, the upper insulator layer 29 of silicon oxide layer is formed by CVD method. The resist pattern R6 is formed on the upper insulator layer 29 by applying photoresist. By using the resist pattern R6 as a mask, a contact hole is formed on the upper insulator layer 29.

After that, the boron doped poly-silicon layer 10P is formed on the upper surface of the semiconductor device. Then the shallow high doped P type diffusion region 28 is obtained. In this exemplary embodiment, the impurity concentration of the high doped P-type diffusion region 28 is $1E18 \sim 5E22$ cm$^{-3}$.

Thus, the PN junction is obtained between the N-type diffusion region 6 and the high doped P-type diffusion region 28. The PN junction (a region where the N-type diffusion region 6 and the P-type region 8 touch each other) has a breakdown voltage smaller than that of peripheral region thereof, since PN junction is formed from the N-type diffusion region 6 and the high doped P-type diffusion region 28 rather than the high doped P-type diffusion region 28 and the N-type epitaxial layer 2. Accordingly, when the PN junction acts as a Zener diode, the inverse current flow the PN junction but does not flow the peripheral region.

As described above, since the impurity concentration of the N-type diffusion region 6 is enough larger than that of the N-type epitaxial layer 2, the deviation of impurity concentration in the N-type epitaxial layer 2 is negligible. Also, the breakdown voltage is determined by the impurity concentrations in the N-type diffusion region 6 and the highly doped P-type diffusion region 28. Therefore, even if there is a deviation in wafer resistivity, the breakdown voltage of thus obtained PN junction does not deviate from required value. Thus a semiconductor device with small deviation in its breakdown voltage is obtained.

Figure 17A:
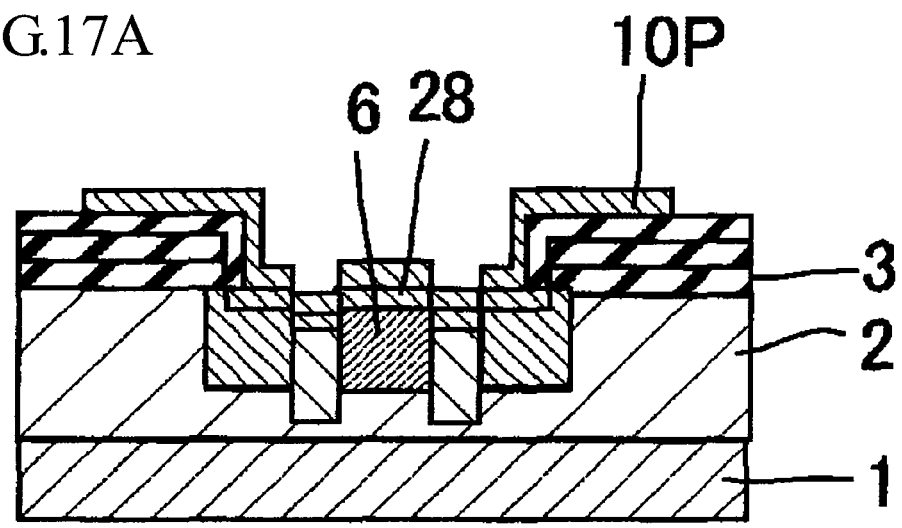
FIGS. 17A to 17B show manufacturing processes for the semiconductor device of the fifth exemplary embodiment.
Figure 17B:
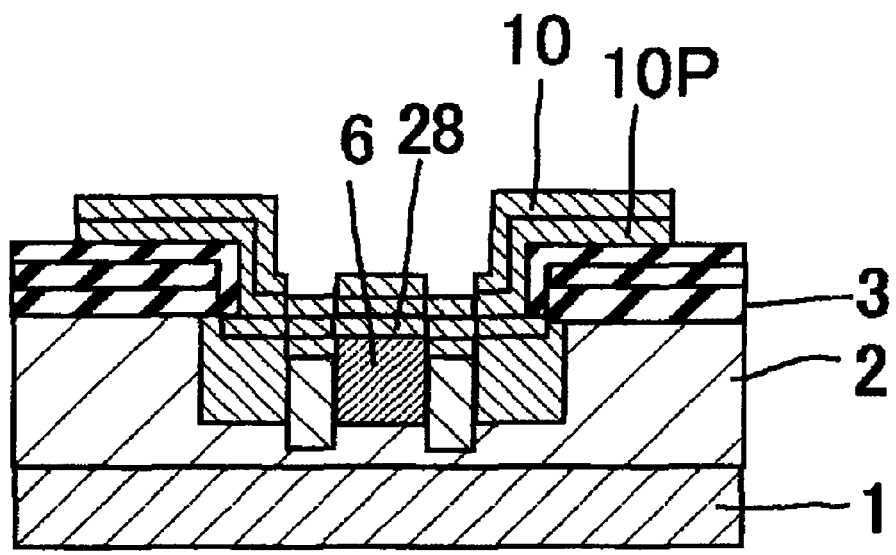

After that, as shown in FIG. 17A, a resist pattern R7 is formed by applying photo resist. The boron doped poly silicon 10P is patterned by using the resist pattern R7 as a mask. Then, as shown in FIG. 17B, an anode electrode 10 of an aluminum film is formed. Then, the protection layer 11 of a silicon nitride film is formed on the anode electrode 10. Thus, the semiconductor device shown in FIG. 15 is completed.

In the configuration of the above described fifth exemplary embodiment, the breakdown voltage (Zener voltage) of the PN junction can be set large by reducing the impurity concentration of the high doped P-type diffusion region 28. Thus, the required Zener voltage is easily obtained.

The required Zener voltage is obtained in good precision because the impurity concentration can be precisely controlled by ion implantation, drive diffusion, and thermal shallow diffusion from poly-silicon layer. As a result, the manufacturing yield is improved and a semiconductor device is provided at a low price.

Sixth Embodiment

Figure 18:
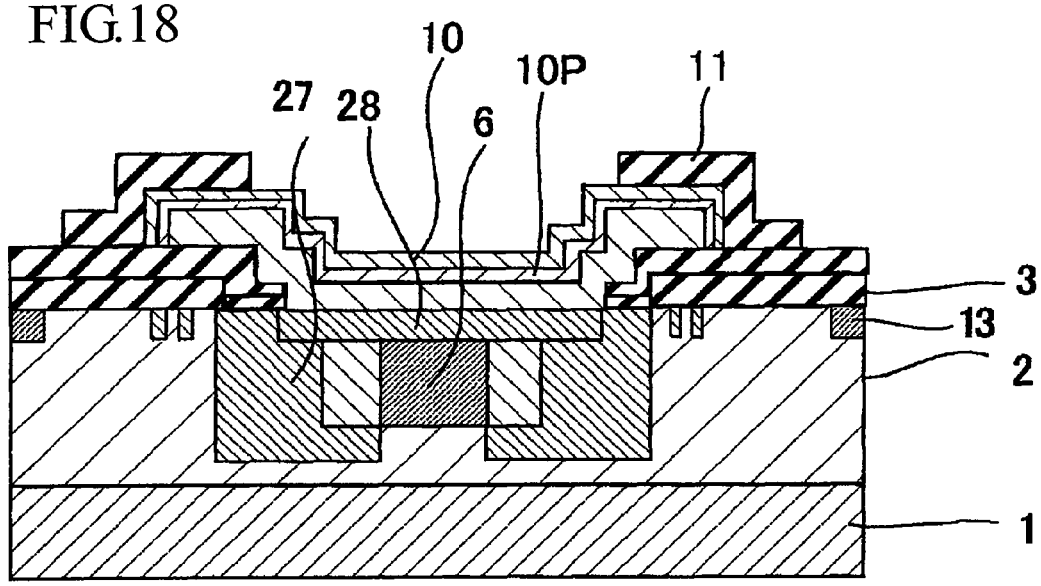
FIG. 18 is a cross sectional view of the sixth exemplary embodiment.

Next, a sixth exemplary embodiment of the present invention is explained below. In the previous embodiments, the guard ring 27 is formed. In the sixth exemplary embodiment, a FLR (Field Limiting Ring) 7F is formed about the guard ring 27 as shown in FIG. 18. In this case, the FLR 7F is formed simultaneously with the guard ring 27. Since the FLR 7F is one or plurality of P-type layers which surround the guard ring 27 and relaxes the electrical field on the surface of the silicon substrate, the breakdown voltage between the guard ring 27 and the N-type epitaxial layer 2 (the peripheral voltage) is high relative to the first and the second embodiments. From a point of view of manufacturing, the FLR 7F is easily formed since the FLR 7F requires only modification of the mask in order to form the guard ring 27. As same as other embodiments, the sixth embodiment provides a Zener diode whose Zener voltage is easily controlled. Especially, the sixth embodiment is effective for the case the Zener voltage more than 7 is required.

The invention claimed is:

1. A semiconductor device comprising:
   a semiconductor substrate having a first conductive type layer;
   a first diffusion region which has the first conductive type and is formed in the first conductive type layer;
   a second diffusion region which has a second conductive type and an area larger than an area of the first diffusion region and overlaps the first diffusion region; and
   a PN junction formed at an interface between the first and the second diffusion regions,
   wherein the second diffusion region includes a ring shaped structure,
   a lower step portion on a surface of the first conductive type layer is formed such that the PN junction is deeper than a bottom of the ring shaped structure,
   the second diffusion region includes a first portion and a second portion, said second portion comprising the ring shaped structure, and
   an upper step portion is formed by an upper surface of the first portion and the second portion.

2. The semiconductor device according to claim 1, wherein the PN junction has a lower breakdown voltage than a breakdown voltage between the first conductive type layer and the second diffusion region.

3. The semiconductor device according to claim 1, wherein a first conductive type impurity concentration of the first diffusion region is larger than a first conductive type impurity concentration of the first conductive type layer.

4. The semiconductor device according to claim 1, further comprising:
   an insulator layer having an opening which is self-aligned to an edge of the second diffusion region.

5. A semiconductor device comprising:
a semiconductor substrate having a first conductive type layer;
a first diffusion region which has the first conductive type and is formed in the first conductive type layer;
a second diffusion region which has a second conductive type and an area larger than an area of the first diffusion region and overlaps the first diffusion region;
a PN junction formed at an interface between the first and the second diffusion regions; and
a guard ring having the second conductive type which surrounds the PN junction,
wherein the second diffusion region has a larger impurity concentration than an impurity concentration of the guard ring,
the guard ring includes a first inverted region which surrounds the first diffusion region, said first inverted region has the second conductive type to which the conductive type of the first diffusion region is inverted, and
said guard ring further includes a second inverted region which surrounds the first inverted region, said second inverted region has the second conductive type to which the conductive type of the first conductive type layer of the semiconductor substrate is inverted.

6. The semiconductor device according to claim 5, wherein a bottom of the first diffusion region is deeper than a bottom of the second diffusion region, and a bottom of the guard ring is deeper than the bottom of the first diffusion region.

* * * * *